United States Patent [19]

Ketchum

[11] Patent Number: 5,413,671
[45] Date of Patent: May 9, 1995

[54] APPARATUS AND METHOD FOR REMOVING DEPOSITS FROM AN APCVD SYSTEM

[75] Inventor: Jeffrey M. Ketchum, Austin, Tex.

[73] Assignee: Advanced Micro Devices, Inc., Sunnyvale, Calif.

[21] Appl. No.: 103,980

[22] Filed: Aug. 9, 1993

[51] Int. Cl.$^6$ .............................................. C23C 16/00
[52] U.S. Cl. ..................................... 216/37; 156/345; 118/719; 118/715; 118/729; 134/42; 134/37; 216/73
[58] Field of Search ................. 156/646, 345; 118/724, 118/719, 715, 729; 134/31, 37, 42

[56] References Cited

U.S. PATENT DOCUMENTS

| | | | |
|---|---|---|---|
| 4,786,352 | 11/1988 | Benzing | 156/646 X |
| 4,834,020 | 5/1989 | Bartholomew et al. | 118/719 |
| 4,859,375 | 8/1989 | Lipisko et al. | 261/20 |
| 4,872,947 | 10/1989 | Wang et al. | 156/345 X |
| 4,981,811 | 1/1991 | Feygenson et al. | 156/653 X |
| 5,078,922 | 1/1992 | Collins et al. | 261/139 |
| 5,122,391 | 6/1992 | Mayer | 427/126.3 |
| 5,136,975 | 8/1992 | Bartholomew et al. | 118/715 |
| 5,158,644 | 10/1992 | Cheung et al. | 156/345 X |
| 5,164,017 | 11/1992 | Möller et al. | 134/22.18 |
| 5,266,153 | 11/1993 | Thomas | 156/345 X |
| 5,288,329 | 2/1994 | Nakamura et al. | 118/719 X |

Primary Examiner—Thi Dang
Attorney, Agent, or Firm—Conley, Rose & Tayon

[57] ABSTRACT

An apparatus and method is provided for removing deposits which accumulate within a continuous APCVD system having more than one reaction chamber. The apparatus includes means for delivering vaporized etchant material at a controlled flow rate to each reaction chamber along the system. The mechanism for channeling or metering etchant to each injector can be achieved by properly shaped receptacles or chambers having one or more inlets and multiple outlets. The apparatus can remove deposits of deposition materials which periodically fill or plug perforations within the chamber floor, the perforation openings being necessary to allow floor purge to the wafer backside surface. The apparatus can also remove deposition material formed upon or between purge curtains surrounding each chamber. The present apparatus can also selectively meter more etchant to one or more reaction chambers in order to remove unusually heavy amounts of deposits formed therein. As such, the present apparatus and method can be used to optimized downtime associated within cleaning a continuous APCVD system by etching each chamber at a rate sufficient to allow all downstream and upstream chambers to be cleaned at approximately the same time without over etching a chamber and causing the deleterious effects associated therewith.

27 Claims, 2 Drawing Sheets

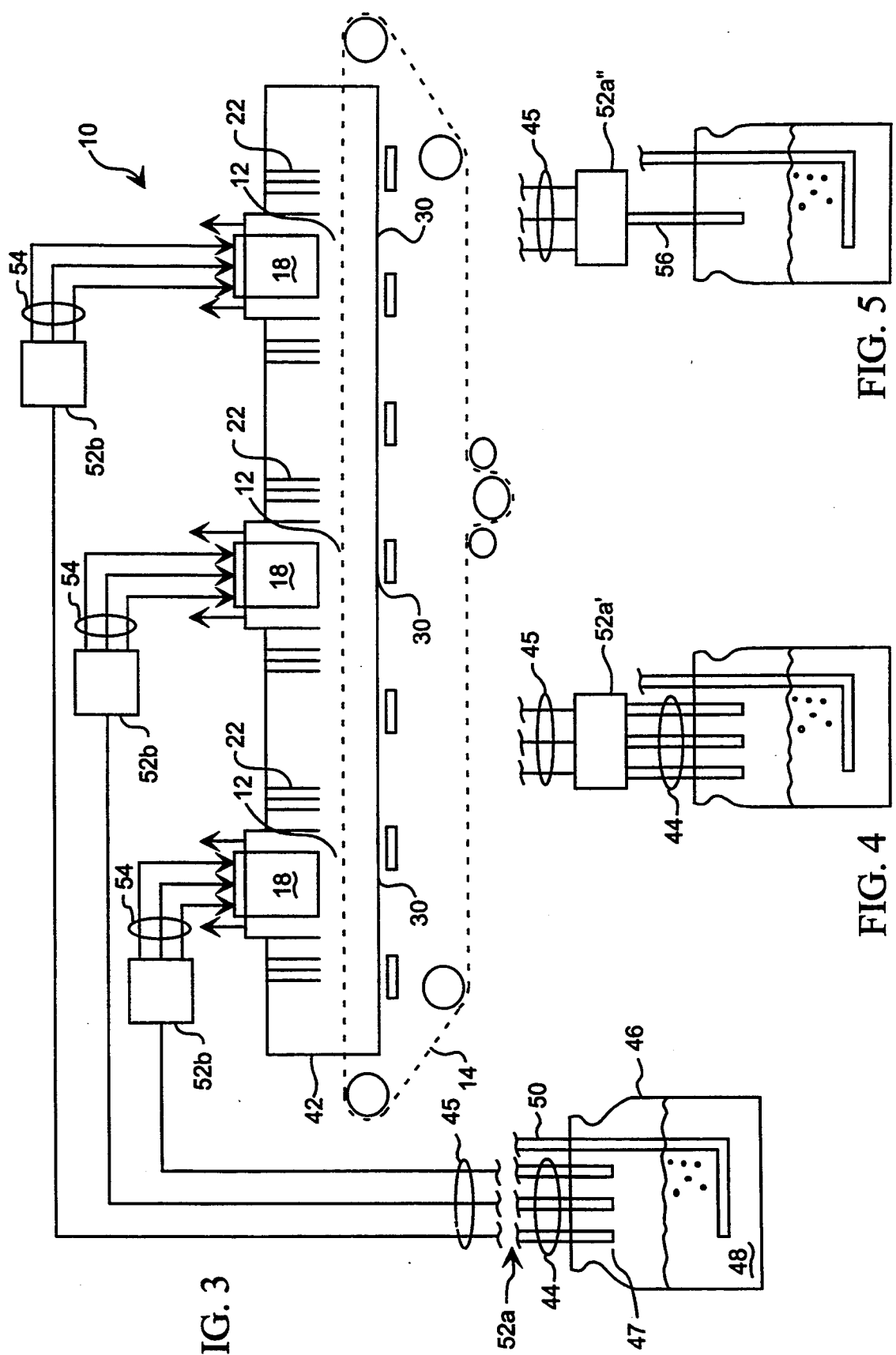

APPARATUS AND METHOD FOR REMOVING DEPOSITS FROM AN APCVD SYSTEM

BACKGROUND OF THE INVENTION

1. Field of the Invention

This invention relates to an atmospheric pressure chemical vapor deposition (APCVD) reactor system and more particularly to an apparatus and method for removing deposits which accumulate within the APCVD system.

2. Background of the Relevant Art

Chemical vapor deposition (CVD) reactors are well known. CVD reactors are used to deposit thin films of various compositions upon a semiconductor substrate. CVD reactors can also be used to pre-deposit a dopant material upon the semiconductor substrate. After the dopant is placed, it can then be driven into the substrate using well known thermal diffusion techniques. CVD systems are therefore recognized as being capable of depositing a film upon the substrate or diffusing a dopant into the substrate. Accordingly, CVD systems are well adapted to many different applications and remain a mainstay in semiconductor fabrication.

There are many different types of CVD systems. Generally speaking a CVD system operates by placing a vaporized deposition or diffusion material into the reactor and over the target or semiconductor substrate. As the vaporized material passes over the substrate, it nucleates and adsorbs upon the substrate. The reaction chamber is typically heated from 300° C. to 900° C. at the nucleation zone in order to bring about the desired reaction. Various inert carrier gases such as, for example, hydrogen can be used to carry the dopant or thin film to the substrate in a vapor form.

Carrier gases are typically used to carry a source (either a solid, gas or liquid source) to the reactor or reaction chamber. The device used to inject a stream of carrier gas into a liquid source is generally referred to as a "bubbler." A typical bubbler is described and shown in U.S. Pat. No. 5,078,922 to Collins, et al. (herein incorporated by reference).

Reactions can take place in either pressurized or non-pressurized CVD chambers. Due to the stringent requirements of film uniformity, low pressure chemical vapor deposition (LPCVD) reactors have gained in popularity. LPCVDs generally operate in the range of 0.1 to 10 torr and can provide high quality film upon the substrate with relatively few impurities or contaminants therein. In many instances, film uniformity or impurity concentration is not critical. In those cases, atmospheric pressure chemical vapor deposition (APCVD) reactors are employed. APCVDs operate at atmospheric pressure and provide higher film growth rate than LPCVDs. Thus, APCVDs can increase wafer throughput.

More recent enhancements to APCVD systems include continuous APCVD systems. Continuous APCVD systems generally utilize a conveyor belt extending through multiple reactors arranged along the belt, whereby wafers are loaded onto the belt and pass through the reactors. See, e.g., Lee, H., *Fundamentals of Microelectronics Processing*, McGraw-Hill, 1990, pp. 220–281. Continuous APCVD systems are well suited for depositing films such as glass or BPSG which do not require stringent flatness or uniformity upon the substrate.

Although continuous APCVD systems are well recognized for their throughput feature, they must be occasionally cleaned of the deposits left behind. Periodically, the deposition material must be removed from the accumulation points within or around each reactor along the system. Specifically, the conveyor belt and drive systems must be periodically cleaned as well as nitrogen purge curtains surrounding each reactor. Moreover, the muffle surrounding the reactions chambers and, particularly, perforations within the muffle directly below each reaction site must be cleaned to ensure the openings remain. If the reaction area and regions surrounding the reaction area (i.e., purge curtains, floor purge perforations, conveyor belt, etc.) are not periodically cleaned of deposits, proper amounts of nitrogen purge will not occur. As a result, the viscous flow from the purge curtains may not occur thereby causing deleterious gas phase nucleation (i.e., nucleation in the gas or vapor surrounding the wafer instead of on the wafer itself). If the perforations underneath each reaction area are filled or become plugged with deposits, proper floor purge through the perforations will not occur. Once the perforations underneath each reactor (i.e., underneath the conveyor belt and wafer substrate) become plugged, nitrogen flow from underneath the reaction site and through the holes will cease thereby allowing impurities to creep into the chamber and collect upon the backside of the wafer. It is important that viscous flow with closely controlled and equalized flow rates occur and are properly directed in and around each of the multiple reactor sites of the continuous APCVD system. Any change or fluctuation from optimal flow rates or redirection of purge gases generally caused by deposit buildup will negatively impact the deposition operation.

It is not only important to periodically clean the reaction areas, but the cleaning step must be non-intrusive and must be easily performed. It is further important that each reaction area be cleaned thoroughly such that the continuous APCVD system, having many reaction areas, is completely cleaned throughout. Each reaction area or chamber must be cleaned simultaneously and at the same rate. If one reaction area is cleaned at a faster rate than another, then one reactor of the continuous APCVD system may be left dirty while the remaining reactors are clean. Additionally, over cleaning of one reactor of the plurality of reactors may cause problems whenever the etching material used to clean the reactor over etches into the reactor material itself instead of simply removing only the deposits upon the reactor surface.

It is therefore important that a cleaning apparatus and method be devised which can clean several reactors or reaction areas simultaneously within a continuous APCVD system. Likewise, it is necessary that the cleaning material used to remove the deposits be directed to areas where deposits are predominately placed and areas where deposits cannot be readily tolerated. For example, it is important that the cleaning material be directed to any and all deposit sites along the continuous APCVD system with minimal operator interface using the existing CVD configuration.

SUMMARY OF THE INVENTION

The problems outlined above are in large part solved by the apparatus and method of the present invention. That is, the apparatus and method hereof used for removing deposits from a continuous APCVD system utilizes existing CVD hardware and can directly and uniformly remove deposits from any and all areas along the continuous APCVD system. In particular, deposits left upon the purge curtains surrounding each of numerous reaction areas can be removed as well as deposits formed within the perforations or holes underlying each reaction area. A substantially equal flow rate of vaporized etchant material can be directed to each injector associated with the reaction chamber, whereby simultaneous and uniform etchant flow can remove deposits from each and every chamber areas throughout the continuous APCVD system. The operator need not clean each chamber one-at-a-time along the system. Furthermore, the operator can be assured that each and every reaction chamber is being etched or cleaned at the same rate in order to avoid over cleaning and problems associated therewith. Still further, by directing equal amounts of etchant flow to each reaction chamber, the operator can reduce the total amount of time necessary to clean a continuous APCVD system thereby keeping with the main advantage of the continuous APCVD system, which is wafer throughput.

Broadly speaking, the present invention contemplates an apparatus for removing deposits from an APCVD system. The apparatus comprises at least two chemical reaction chambers spaced from each other along the longitudinal path. Each reaction chamber has an upper surface and a lower surface extending a finite distance along the path, and the upper surface of each reaction chamber is adapted to receive an injector, while the lower surface of each reaction chamber includes a plurality of purging holes placed through the lower surface underneath the injector. Two sets of purging curtains are provided on opposite sides of each reaction chamber. A bubbler is also provided, wherein the bubbler comprises a bubbler chamber adapted to receive a liquid etchant and a sparger tube connected within the bubbler chamber. The sparger tube is adapted to deliver a carrier gas into the liquid etchant thereby causing the liquid etchant to vaporize and diffuse into the carrier gas to form a vaporized etchant material. Means is provided for delivering the vaporized etchant material at a controlled flow rate, or at a uniform flow rate, to each injector. A diffusing screen is also provided capable of being coupled to the injector for diffusing the vaporized etch material in an even flow path across the plurality of purging holes and also across the purging curtains for removing deposits therefrom.

The delivering means includes receptacles coupled between respective outlet flow tubes extending from the bubbler chamber and a respective sets of injector inlet tubes extending from the chemical reaction chamber injectors. The delivering means may alternatively include a multiple inlet/multiple outlet flow meter coupled between the outlet flow tubes and a respective set of injector inlet tubes. Still further, the delivering means may alternatively include a single inlet/multiple outlet flow meter coupled between a single outlet flow tube and a respective set of injector inlet tubes.

The present invention further contemplates a method for removing deposits from an APCVD system. The method comprises the steps of providing a plurality of chemical reaction chambers, wherein each chamber has deposits formed upon a perforated floor of the chamber and upon and between sets of purging curtains arranged on opposite sides of the reaction chamber. Vaporized etchant material can be withdrawn from an etchant source, and the vaporized etchant is delivered at a controlled flow rate, or at a substantially equal flow rate, to each reaction chamber and upon the perforated floor and purging curtains to remove the deposits therefrom.

BRIEF DESCRIPTION OF THE DRAWINGS

Other objects and advantages of the invention will become apparent upon reading the following detailed description and upon reference to the accompanying drawings in which:

FIG. 3 is a plan view of a continuous APCVD system retrofitted to accept uniform flow of etchant material to the continuous APCVD system according to the present invention;

FIG. 4 is an exemplary alternative embodiment of a bubbler system for delivering uniform flow of etchant material to the continuous APCVD system according to the present invention; and FIG. 5 is yet another exemplary alternative embodiment of a bubbler system for delivering uniform flow of etchant material to the continuous APCVD system according to the present invention.

Figure 1:
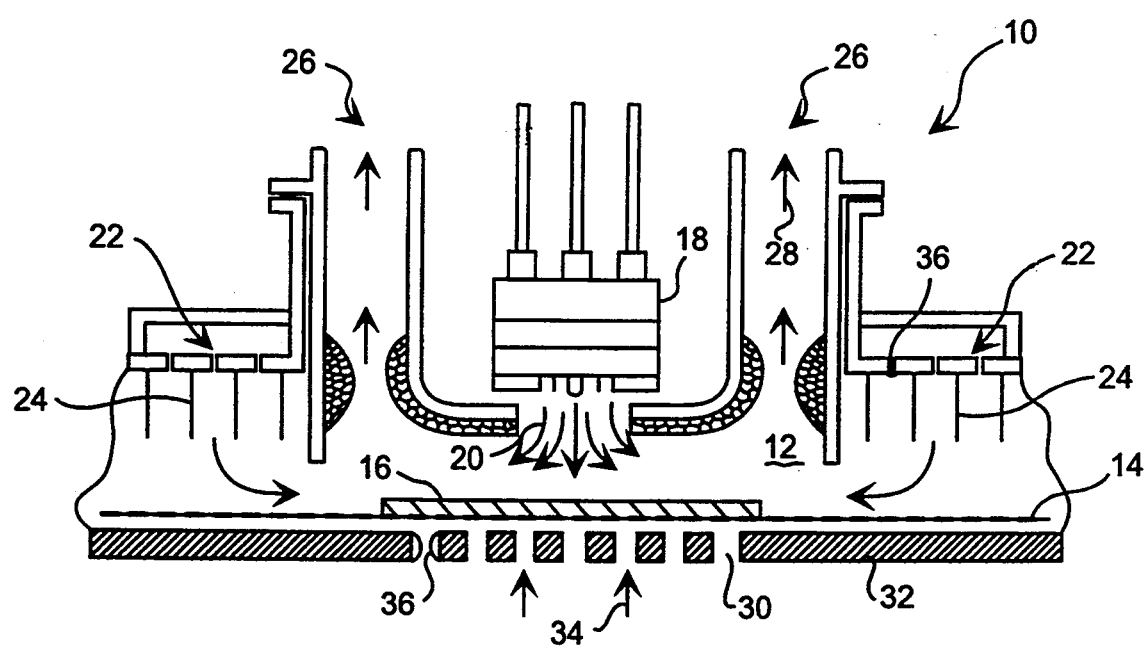
FIG. 1 is a cross-sectional view of a single reaction chamber within a continuous APCVD system according to the present invention.
Figure 2:
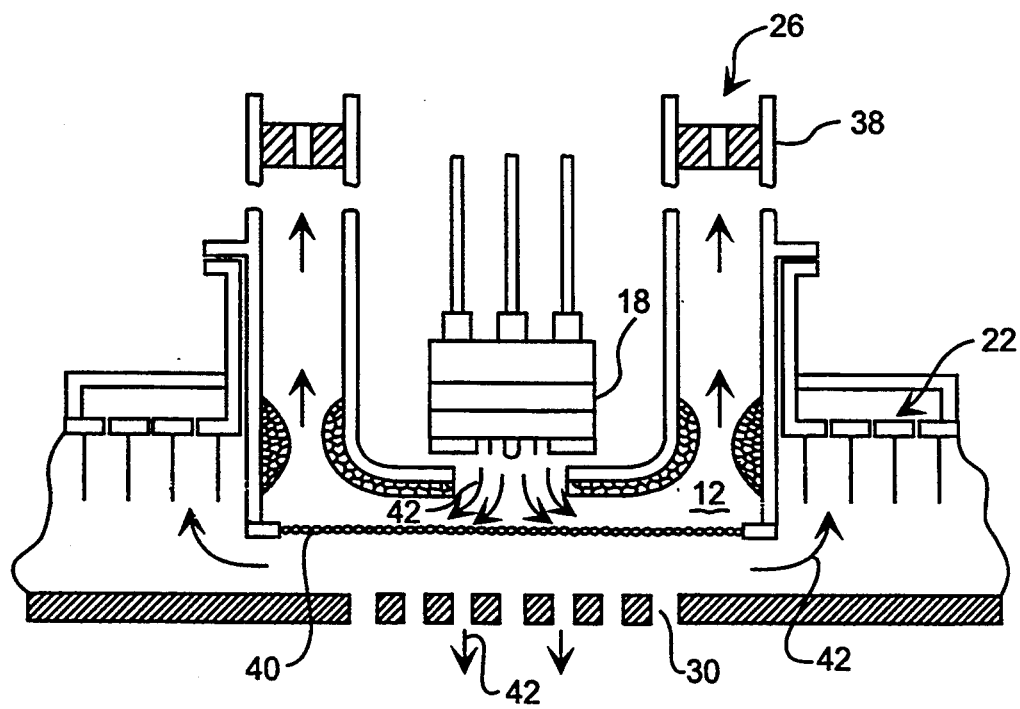
FIG. 2 is a cross-sectional view of a single reaction chamber within a continuous APCVD system shown retrofitted to accept vaporized etchant material according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modification, equivalents and alternatives falling within the spirit and scope of the present invention as defined by the appended claims.

DETAILED DESCRIPTION OF THE INVENTION

Turning now to the drawings, FIG. 1 illustrates a portion of a continuous APCVD system 10 and, specifically, a single reaction chamber 12. System 10 includes at least two and preferably three reaction chambers 12 spaced along a longitudinal path through which a belt 14 extends. Belt 14 is arranged upon a conveyor system and receives upon its upper surface a plurality of wafers 16, each wafer capable of being carried along the longitudinal path through system 10 by movement of belt 14. As wafers 16 enter chamber 12, thin film materials or dopant materials are directed upon wafer 16 via injector 18. Injector 18 is well suited for receiving vaporized material and/or mixing various vaporized components and for placing the subsequent material upon the upper surface of wafer 16 as shown by arrows 20. Any type of material which can be deposited upon wafer 16 falls within the scope of the present invention. Accordingly, that material can be removed from various deposit sites within system 10 as will be described below.

To ensure the vaporized material remains within its respective reaction chamber 12, various purge locations are arranged about chamber 12. In particular, two sets of purge curtains are arranged on opposite sides of each chamber 12. The curtains extend downward as baffles 24 for directing a flow of nitrogen into chamber 12 from opposite sides of the chamber. The nitrogen purge is then vented by outlet exhaust 26 as shown by arrows 28.

Purge curtains 22 extend on opposite ends of each chamber 12 and extend across the longitudinal path formed by system 10. Purge curtains 22 thereby ensure there is minimal cross-talk between adjacent reaction chambers (i.e., prevents deposition or diffusion material within one chamber from being sent to another chamber).

Purge curtains 22 also help to remove unwanted impurities from chamber 12 by forcing a viscous flow of nitrogen around the wafer so as to sweep the impurities away along with the spent (or unused) deposition or diffusion material. In order to further ensure that impurities not be allowed to settle on the backside surface of wafer 16, an additional floor purge of nitrogen is created through perforations 30 formed within floor 32 of chamber 12. Perforations 30 exist to ensure a path for nitrogen, as shown by arrows 34, to flow around the outer edges of wafer 16 and from the wafer's backside surface. The floor purge of nitrogen is then vented through exhaust 28, similar to the nitrogen from purge curtains 22. A further description of a continuous APCVD system utilizing purge curtains, injectors, exhaust areas, conveyor belts, etc., is fully described in U.S. Pat. No. 5,122,391 to Mayer, and is herein incorporated by reference.

It has been discovered that after three to four months of continuous use, the purging system necessary for proper operation of system 10 begins to malfunction. Specifically, deposition and diffusion material from injectors 18 accumulate over time in the small openings through which nitrogen purge is transmitted. Unless system 10 is periodically cleaned, wafers 16 sent therethrough begin to experience unacceptable variations in deposition thickness and contains unusually large amounts of contaminants. Areas where a viscous flow of nitrogen should exist, may no longer occur if the exit ports become plugged with deposits. Areas without a sufficient nitrogen flow will not blow away contaminants and will allow larger amounts of unwanted material to deposit upon wafer areas adjacent the plugged nitrogen ports. Generally, deposits from the vaporized material emitted from injector 18, such as silicon oxide or glass, accumulate over time within the perforations at the floor of chamber 32 and on or between baffles 24 of purge curtains 22 as shown by reference numeral 36.

In order to remove deposits 36, each reactor or reaction chamber 12 must be slightly modified. It is preferred that the outlet exhaust 26 or each chamber 12 be restricted in size by placing orifice constrictors 38 in the flow path of each exhaust 26. Constrictors 38 reduce the amount of material being exhausted from chamber 12. Preferably, nitrogen is no longer sent to chamber 12 during the cleaning process. Instead a vaporized etchant material such as, for example, hydrogen fluoride (HF) is sent to chamber 12 from injector 18. Hydrogen fluoride is diffused through a diffusing screen 40 such that the vaporized etchant will spread laterally across perforations 30 and onto purge curtains 22 as shown by arrows 42. After a period of time has elapsed, and deposits 36 are removed from perforations 30 and purge curtains 22, screen 40 and constrictors 38 can then be removed and normal deposition operations resumed.

It is important that the total time needed to clean system 10, containing multiple upstream/downstream chambers 12, be minimized in order to take advantage of the main feature of a continuous APCVD system: to provide wafer throughput. Retrofitting system 10 by removing belt 14 and adding constrictors 38 and screen 40, consumes minimal time. Generally speaking, the time needed to retrofit the system is usually three to four hours. Once system 10 has been retrofitted, the process of sending vaporized etchant material to chamber 12 for a duration necessary to eliminate deposits 36 is generally ten to twelve hours, depending upon the amount of deposition time elapsed between cleanings.

In order to clean the entire system 10 from deposits 36, each and every reactor must be cleaned. It is not beneficial to clean each chamber 12 separately. Instead, in accordance with the present invention, it is more beneficial to clean all downstream and upstream reactors simultaneously by placing the same flow rate of vaporized etchant into each reactor and, if needed, adjust the flow rate to remove heavy deposits in certain reactors and lighter deposits in other reactors. The advantage being to minimize clean time by ensuring all reactors are being cleaned simultaneous and that the cleaning of all reactors be completely quickly and at the same time. FIG. 3 illustrates an exemplary system 10 utilizing three reaction chambers 12. Deposits 36 on curtains 22 and perforations 30 can be evenly and simultaneously removed by controlling the flow amount of vaporized etchant sent to each injector 18. As such, the entire muffle area 42 of system can be cleaned in a controlled fashion across its entire surface in order to ensure that certain areas are not over cleaned or over etched by the etchant.

If certain areas should receive an over abundance of vaporized etchant, there is a likelihood that the etchant, such as hydrogen fluoride, may cause breakdown of the chamber walls or muffle material. Generally, over etching of hydrogen fluoride can partially consume or destroy the stainless steel material or silicon rubber gaskets found within muffle 42 and chamber 12. A continuous APCVD system utilizing stainless steel material, and specifically, stainless steel materials made from Anconal® 601 and having silicon rubber gaskets is available from Watkins-Johnson, Corp. of Palo Alto, Calif., model no. 998/999.

As FIG. 3 illustrates, one way in which to control the amount of vaporized etchant sent to each injector is to configure multiple outlet flow tubes 44 within a bubbler 46 such that the distal ends 47 of each tube 44 are spaced apart and are at substantially the same elevation above liquid etchant 48. An exemplary, conventional liquid bubbler apparatus and operation thereof is described in U.S. Pat. No. 5,078,922 to Collins, et al. (incorporated herein by reference). A carrier gas such as hydrogen is inserted into sparger tube 50, and bubbles formed at openings near the end of tube 50 diffuse with liquid etchant 48. The diffused product is then forced as vaporized etchant material into substantially equal proportion into tubes 44, where the vaporized etchant is then sent to a delivering means 52. Delivering means 52, shown in FIG. 3, includes a straight connection input 52a to a channel means 52b.

Delivering means 52 (including site 52a and 52b shown in FIGS. 3, 4 and 5) can take on several different configurations and can have several different forms of operation. Specifically, means 52 can be either passive, active or a combination thereof. If fully passive, means 52 includes a straight connection at site 52a between outlet flow tubes 44 and inlet flow tubes 45, and a passive receptacle is used at site 52b coupled between tubes 45 and sets of injector inlet tubes 54. Each inlet flow tube 45 receives vaporized etchant and delivers the etchant to all three injector inlet tubes 54 in equal flow quantities or in metered, dissimilar, quantities to select injector inlet tubes 54 or to only one or two inlet tubes 54. In many instances, only one inlet tube 54 is necessary to receive the vaporized etchant, the other two tubes can be blocked off or plugged by the cleaning operator. In other instances, it may be possible to use two or all three inlet tubes 54. In either case, site 52b can be a passive receptacle necessary to carry forward the desired etchant to one or more injectors 18. The inner walls of passive receptacle 52b can be shaped in order to direct a main vapor flow in equal quantities to each and every tube 54 or only to select tubes, in unequal flow quantities. If fully active, means 52 can pump select vapor flow quantities to one or more outlets. An active pump or meter at site 52a ensures that equal or non-equal amounts are sent to tubes 45 from tubes 44. Likewise, further metering can occur by placing a pump at site 52b to accommodate further variations in flow disbursement among upstream and downstream chambers 12. Still further, means 52 can have both active and passive sites 52a and 52b, and can utilize active pumps at either site 52a or 52b, while the other site is merely a channel or flow director. Multiple combination or embodiments of active and passive devices allows the user more flexibility in choosing a desired flow rate at each and every injector site. It is therefore appreciated that delivery means includes site areas 52a and 52b which can be passive flow directors (i.e., channels) or can be active pumping mechanisms for drawing vaporized etchant from bubbler 46 and dispersing that etchant in a controlled fashion to injectors 18, or dispersing that etchant at a uniform flow rate to each injector 18. Further description for various configurations and modifications of bubbler 46 and site location 52a is described below and illustrated in alternative bubbler arrangements of FIGS. 4 and 5.

Turning now to FIG. 4, an alternative embodiment of one aspect of delivering means 52, and specifically site 52a', is shown. Site 52a' can include an active pump for drawing vaporized etchant from bubbler 46 via tubes 44 and injecting that etchant into tubes 45. Unlike the passive delivery site 52a (i.e., direct connection) as shown in FIG. 3, site 52a' of FIG. 4 ensures that constant metering and controlled flow is provided into tubes 45 regardless of whether the distal ends 47 are spaced equally above liquid etchant 48 of FIG. 3. An advantage in using an active device (i.e., a device which can pump or change configuration upon receipt of mechanical or electrical stimuli) is that the operator can adjust the flow into the downstream outlet tubes. Adjustment can be programmably controlled. Thus, when using active devices, the operator can adjust the flow among injectors in a programmable fashion throughout the etching/cleaning process. In many instances, the upstream reaction chamber may undergo more severe deposit buildup thereby requiring more etchant being delivered thereto. In such instances, having an adjustable active device at site 52a' or at site 52b allows the operator to regulate flow to the heavy deposits in order to maximum cleaning time and to ensure cleaning of the entire system 10 is completed at the same time—a necessary requirement to minimize downtime of the system.

Referring now to FIG. 5, a further alternative embodiment is shown. Instead of using multiple outlet flow tubes 44, a single flow tube 56 is shown. Site 52a'' can regulate vaporized etchant to all three inlet tubes in controlled fashion or in equal proportion, either by active or passive means. Site 52a'' presents a single inlet/multiple outlet metering device coupled between a single outlet flow tube 56 and downstream sets of injector inlet tubes 54 and immediate downstream inlet tubes 45. Site 52a', shown in FIG. 4, therefore represents multiple inlet/multiple outlet passive or active channeling device coupled between multiple outlet flow tubes 44 and downstream sets of injector inlet tubes 54 and immediate downstream inlet tubes 45.

It will be appreciated to those skilled in the art having the benefit of this disclosure that this invention is believed to be capable of applications with any type of continuous APCVD system including systems having more than one reaction chamber. Furthermore, it is to be understood that the form of the invention shown and described is to be taken as presently preferred embodiments. Various modifications and changes may be made without departing from the spirit and scope of the invention as set forth in the claims. Any exemplary modification might be one which uses numerous types of deposition materials and numerous dissimilar types of etchant material. Provided the etchant material chosen can remove the deposition material, any form of deposition material and/or etchant material can be utilized by the present invention. Still further, the arrangement of the vaporized source and the production of that vapor can be obtained from any source apparatus including, but not limited to, a liquid source bubbler. The vaporized material can be simultaneously sent in equal flow amounts to each and every chamber throughout the system, or can be regulated such that select downstream or upstream chambers can receive more etchant material than other chambers. It is intended that the following claims be interpreted to embrace all such modifications and changes.

What is claimed is:

1. A method for removing deposits from an APCVD system comprising:

providing an APCVD system having a plurality of chemical reaction chambers, each chamber having deposits formed upon a perforated floor of said chamber and upon and between sets of purging curtains arranged on opposite sides of said reaction chamber;

withdrawing vaporized etchant material from an etchant source; and delivering said vaporized etchant material at a controlled flow rate to each said reaction chamber and upon said perforated floor and purging curtains to remove the deposits therefrom.

2. The method as recited in claim 1, wherein said withdrawing step comprises arranging outlet flow tubes within a bubbler chamber, wherein the distal ends of said outlet flow tubes are spaced apart and are at substantially the same elevation above said etchant source.

3. The method as recited in claim 1, wherein said withdrawing step comprises metering vaporized etchant material from said etchant source to equal flow quantities to respective said chemical reaction chambers.

4. The method as recited in claim 1, wherein said delivering step comprises placing a diffusing screen within said reaction chamber and within a flow path of said vaporized etchant material in order to direct said vaporized etchant material to said perforated floor and purging curtains.

5. An APCVD system having means for removing deposits in situ, said system comprising:

an APCVD system having at least two chemical reaction chambers spaced from each other along a longitudinal path, each said reaction chamber having an upper surface and a lower surface extending a finite distance along said path wherein the upper surface of each reaction chamber includes an injector and the lower surface of each reaction chamber includes a plurality of purging holes placed through the lower surface underneath the injector; two sets of purging curtains coupled on opposite sides of each said reaction chamber;

a bubbler comprising a bubbler chamber for receiving a liquid etchant and a sparger tube connected within said bubbler chamber, said sparger tube receives a carrier gas for placement into said liquid etchant thereby causing said liquid etchant to vaporize and diffuse into said carrier gas to form a vaporized etchant material;

means for delivering said vaporized etchant material at a controlled flow rate to each said injector; and a diffusing screen coupled to said injector for diffusing said vaporized etchant material in an even flow path across said plurality of purging holes and across said purging curtains for removing deposits therefrom.

6. The apparatus as recited in claim 5, wherein said delivering means comprises:

at least two outlet flow tubes connected to said bubbler chamber to receive said vaporized etchant material, wherein the distal ends of said outlet flow tubes are spaced apart and are at substantially the same elevation above said liquid etchant in order to receive said vaporized etchant material at the same flow rate within each said outlet flow tube;

at least two sets of injector inlet tubes, each set of injector inlet tubes being connected to each said injector; and at least two receptacles coupled between respective outlet flow tubes and respective set of injector inlet tubes, whereby each receptacle includes a receptacle inlet for receiving one of said outlet flow tubes and further includes a plurality of receptacle outlets for channeling vaporized etchant material from said outlet flow tube to said set of injector inlet tubes.

7. The apparatus as recited in claim 6, wherein each set of said injector inlet tubes comprises three injector inlet tubes.

8. The apparatus as recited in claim 6, wherein said receptacle comprises a passive distribution chamber having said plurality of receptacle outlets arranged within the flow path of said receptacle inlet such that said flow path is evenly distributed into said receptacle outlets.

9. The apparatus as recited in claim 6, wherein said receptacle comprises a valve for preventing reversal of direction of said flow path.

10. The apparatus as recited in claim 5, wherein said delivering means comprises:

at least two outlet flow tubes connected to said bubbler chamber to receive said vaporized etchant material, wherein the distal ends of said outlet flow tubes are spaced above said liquid etchant;

at least two sets of injector inlet tubes, each set of injector inlet tubes being connected to each said injector; and a multiple inlet and multiple outlet flow meter coupled between said outlet flow tubes and said sets of injector inlet tubes.

11. The apparatus as recited in claim 10, wherein each set of said injector inlet tubes comprises three injector inlet tubes.

12. The apparatus as recited in claim 10, wherein said inlet and multiple outlet flow meter comprises a pumping chamber for actively metering vaporized etchant material from each of said outlet flow tubes at a controlled rate into each of said sets of injector inlet tubes.

13. The apparatus as recited in claim 5, wherein said delivering means comprises:

an outlet flow tube connected to said bubbler chamber to receive said vaporized etchant material, wherein the distal end of said outlet flow tube is arranged above said liquid etchant;

at least two sets of injector inlet tubes, each set of injector inlet tubes being connected to each said injector; and a single inlet and multiple outlet flow meter coupled between said outlet flow tube and said sets of injector inlet tubes.

14. The apparatus as recited in claim 13, wherein each set of said injector inlet tubes comprises three injector inlet tubes.

15. The apparatus as recited in claim 13, wherein said single inlet and multiple outlet flow meter comprises a pumping chamber for actively metering vaporized etchant material from said outlet flow tube at a controlled rate into each of said sets of injector inlet tubes.

16. An APCVD system having means for removing deposits in situ, said system comprising:

three chemical reaction chambers spaced from each other along a longitudinal path, each said reaction chamber having an upper surface and a lower surface extending a finite distance along said path, wherein the upper surface of each reaction chamber includes an injector and the lower surface of each reaction chamber includes a plurality of purging holes placed through the lower surface directly underneath a flow path created by the injector;

two sets of purging curtains coupled on opposite sides of each said reaction chamber;

a bubbler comprising a bubbler chamber for receiving a liquid etchant and a sparger tube connected within said bubbler chamber, said sparger tube receives a carrier gas for placement into said liquid etchant thereby causing said liquid etchant to vaporize and diffuse into said carrier gas to form a vaporized etchant material; and means for controllably delivering said vaporized etchant material from said bubbler in three equal flow quantities to respective said chemical reaction chambers and to the purging holes placed through the lower surface of each said chamber as well as the purging curtains coupled on opposite side of each said chamber.

17. The apparatus as recited in claim 16, further comprising a diffusing screen coupled to each said injector and within the flow path of said injector for diffusing said vaporized etchant material across said plurality of purging holes and across said purging curtains for removing deposits therefrom.

18. The apparatus as recited in claim 16, wherein said delivering means comprises:

three outlet flow tubes connected to said bubbler chamber to receive said vaporized etchant material, wherein the distal ends of said outlet flow tubes are spaced apart and are at substantially the game elevation above said liquid etchant in order to receive said vaporized etchant material at the same flow rate within each said outlet flow tube;

three sets of injector inlet tubes, each set of injector inlet tubes being connected to each said injector; and a receptacle coupled between an outlet flow tube and a respective set of injector inlet tube, said receptacle includes a receptacle inlet for receiving one of said outlet flow tubes and further includes a plurality of receptacle outlets for channeling vaporized etchant material from said outlet flow tube to one set of injector inlet tubes.

19. The apparatus as recited in claim 18, wherein each set of said injector inlet tubes comprises three injector inlet tubes.

20. The apparatus as recited in claim 18, wherein said receptacle comprises a passive distribution chamber having said plurality of receptacle outlets arranged within the flow path of said receptacle inlet such that said flow path is evenly distributed at substantially similar flow rates into said receptacle outlets.

21. The apparatus as recited in claim 18, wherein said receptacle comprises a valve for preventing reversal of direction of said flow path.

22. The apparatus as recited in claim 18, wherein said delivering means comprises:

three outlet flow tubes connected to said bubbler chamber to receive said vaporized etchant material, wherein the distal ends of said outlet flow tubes are spaced above said liquid etchant;

three sets of injector inlet tubes, each set of injector inlet tubes being connected to each said injector; and a three inlet and three outlet flow meter coupled between said outlet flow tubes and said sets of injector inlet tubes.

23. The apparatus as recited in claim 22, wherein each set of said injector inlet tubes comprises three injector inlet tubes.

24. The apparatus as recited in claim 22, wherein said multiple inlet and multiple outlet flow meter comprises a pumping chamber for actively metering vaporized etchant material from each of said outlet flow tubes uniformly into each of said sets of injector inlet tubes.

25. The apparatus as recited in claim 12, wherein said delivering means comprises:

an outlet flow tube connected to said bubbler chamber to receive said vaporized etchant material, wherein the distal end of said outlet flow tube is arranged above said liquid etchant;

three sets of injector inlet tubes, each set of injector inlet tubes being connected to each said injector; and a single inlet and three outlet flow meter coupled between said outlet flow tube and said three sets of injector inlet tubes.

26. The apparatus as recited in claim 25, wherein each set of said injector inlet tubes comprises three injector inlet tubes.

27. The apparatus as recited in claim 25, wherein said single inlet and multiple outlet flow meter comprises a pumping chamber for actively metering vaporized etchant material from said outlet flow tube uniformly into each of said sets of injector inlet tubes.

* * * * *

UNITED STATES PATENT AND TRADEMARK OFFICE
CERTIFICATE OF CORRECTION

PATENT NO. : 5,413,671
DATED : May 9, 1995
INVENTOR(S) : Jeffrey Ketchum

It is certified that error appears in the above-indentified patent and that said Letters Patent is hereby corrected as shown below:

Claim 18, col. 11, line 3, please delete "game" and substitute therefor --same--.

Claim 25, col. 12, line 15, please delete "12" and substitute therefor --22--.

Signed and Sealed this

Twenty-ninth Day of August, 1995

Attest:

BRUCE LEHMAN

*Attesting Officer*   *Commissioner of Patents and Trademarks*